(12) United States Patent  
Sato (10) Patent No.: US 6,694,611 B2  
(45) Date of Patent: Feb. 24, 2004

(54) METHOD FOR MANUFACTURING A THIN-FILM STRUCTURE HAVING A RELIABLY REMOVABLE OXIDE LAYER

(75) Inventor: Kiyoshi Sato, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 136 days.

(21) Appl. No.: 09/919,107

(22) Filed: Jul. 31, 2001

(65) Prior Publication Data

US 2001/0042304 A1 Nov. 22, 2001

Related U.S. Application Data

(62) Division of application No. 09/569,155, filed on May 11, 2000, now Pat. No. 6,476,485.

(30) Foreign Application Priority Data

May 13, 1999  (JP) ............................................. 11-132602

(51) Int. Cl.[7] .............................. H01R 9/00; H05K 3/00
(52) U.S. Cl. .............................. 29/843; 29/846; 29/854; 257/738; 257/752; 257/762
(58) Field of Search .......................... 29/842–847, 854; 257/427, 787, 738, 750, 752, 762, 766; 360/110

(56) References Cited

U.S. PATENT DOCUMENTS

| | | | |
|---|---|---|---|
| 4,856,181 A | 8/1989 | Pichler et al. ................ 29/603 |
| 4,949,209 A | 8/1990 | Imanaka et al. ............. 360/126 |
| 5,001,591 A | 3/1991 | Nakashima ................. 360/126 |
| 5,326,429 A | 7/1994 | Cohen et al. ............... 156/655 |
| 5,650,897 A | 7/1997 | Cohen et al. ............... 360/126 |
| 5,738,931 A | * | 4/1998 | Sato et al. .................. 428/209 |
| 6,042,682 A | * | 3/2000 | Funaya et al. ............... 29/832 |
| 6,468,582 B1 | * | 10/2002 | Sakemi ........................ 427/96 |

FOREIGN PATENT DOCUMENTS

| | | |
|---|---|---|
| JP | 4-362507 | 12/1982 |
| JP | 5-314448 | 11/1993 |
| JP | 409199533 A | 7/1997 |
| JP | 11004065 A | 1/1999 |

\* cited by examiner

Primary Examiner—Peter Vo  
Assistant Examiner—Donghai D. Nguyen  
(74) Attorney, Agent, or Firm—Brinks Hofer Gilson & Lione (57) ABSTRACT

In a thin-film structure, since a flat face of a bump, which is exposed at the surface of an insulating layer and is to be in contact with an electrode layer, is an exposed surface of a nickel layer, an oxide layer on the flat face can be reliably removed by using ion-milling or sputter etching.

2 Claims, 9 Drawing Sheets

METHOD FOR MANUFACTURING A THIN-FILM STRUCTURE HAVING A RELIABLY REMOVABLE OXIDE LAYER

This application is a divisional application of U.S. application Ser. No. 09/569,155 filed on May 11, 2000, now U.S. Pat. No. 6,476,485, entitled "Thin-Film Structure Having Reliably Removable Oxide Layer Formed on Bump Exposed at Surface of Insulating Layer and Manufacturing Method Therefor."

BACKGROUND OF THE INVENTION

1. Field of the Invention

The present invention relates to a thin-film structure in which an insulating layer is formed on an electrically conductive layer, a bump formed on the surface of the electrically conductive layer is exposed at the surface of the insulating layer, and the surfaces of the bump and the insulating layer are flush with each other so as to form a flat face, and more particularly, relates to a thin-film structure in which an oxide layer formed on the bump exposed at the surface of the insulating layer can be reliably removed.

2. Description of the Related Art

Figure 9:
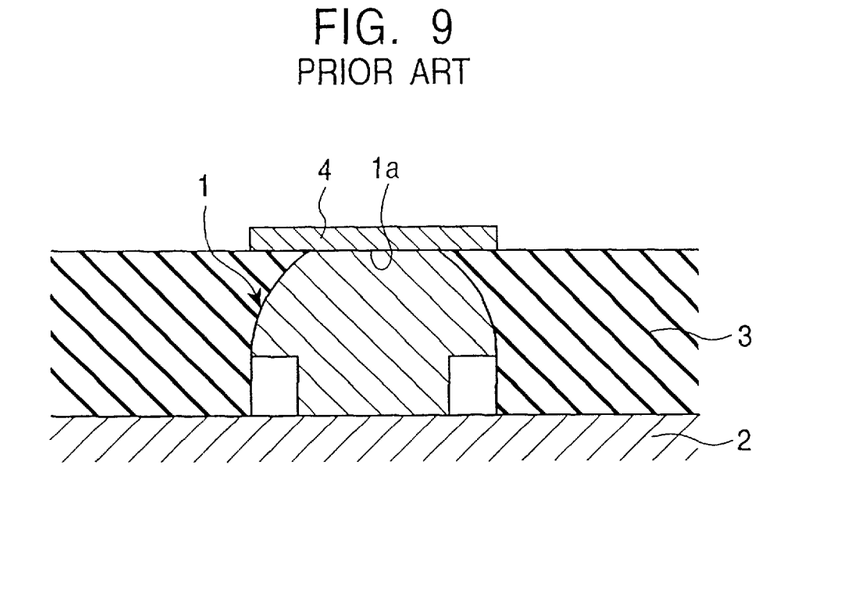
FIG. 9 is a cross-sectional view showing a conventional thin-film structure.

FIG. 9 is a cross-sectional view of a conventional thin-film structure. In this thin-film structure, for example, an insulating layer 3 composed of $Al_2O_3$ or $SiO_2$ is formed on an electrically conductive layer 2, such as an elevating layer, composed of copper or the like and in contact with a lead layer extending from a coil layer of an inductive magnetic head, and a bump 1 is formed on the surface of the electrically conductive layer 2. The bump 1 is exposed at the surface of the insulating layer 3, and the surfaces of the bump 1 and the insulating layer 3 are flush with each other so as to form a flat face.

The bump 1 constructing a conventional thin-film structure is a single-layer structure formed by an isotropic plating of copper or an electrically conductive material containing copper. An electrode layer 4 electrically contacting the bump 1 is formed on a flat face 1a of the bump 1. The electrode layer 4 is made of gold.

A thin-film device, such as an inductive magnetic head, is connected to a wiring member (not shown) which transmits signals at the electrode layer 4 of the thin-film structure. Recording signals inputted via the electrode layer 4 are transmitted through the bump 1 and the electrically conductive layer 2.

Figure 10:
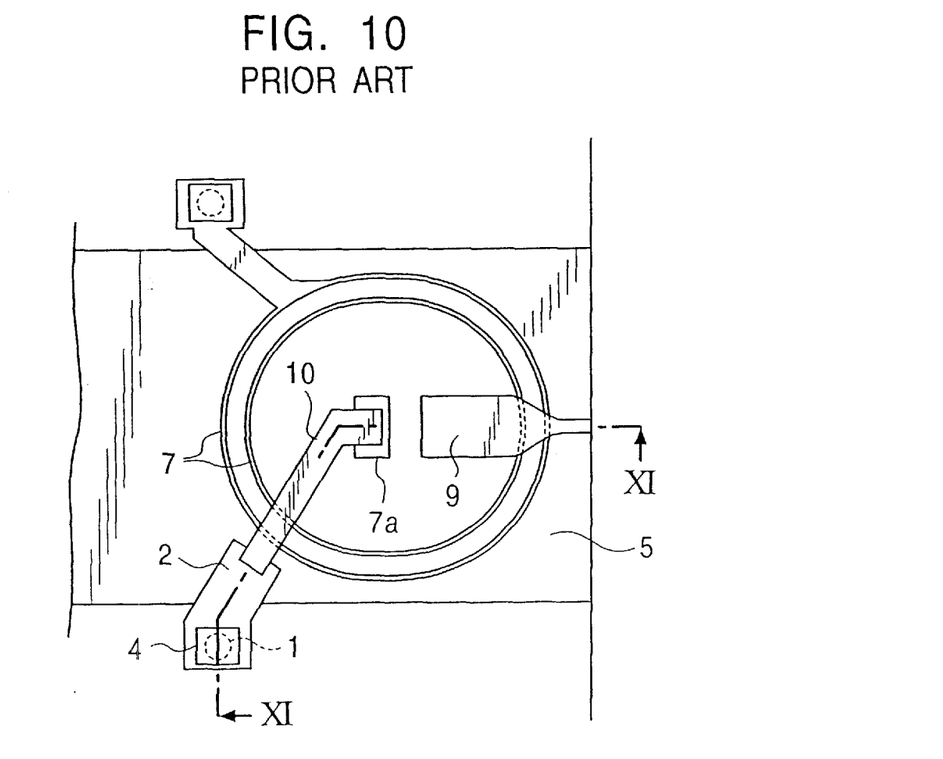
FIG. 10 is a plan view of an MR/inductive hybrid thin-film magnetic head having an inductive head composed of a conventional thin-film structure.
Figure 11:
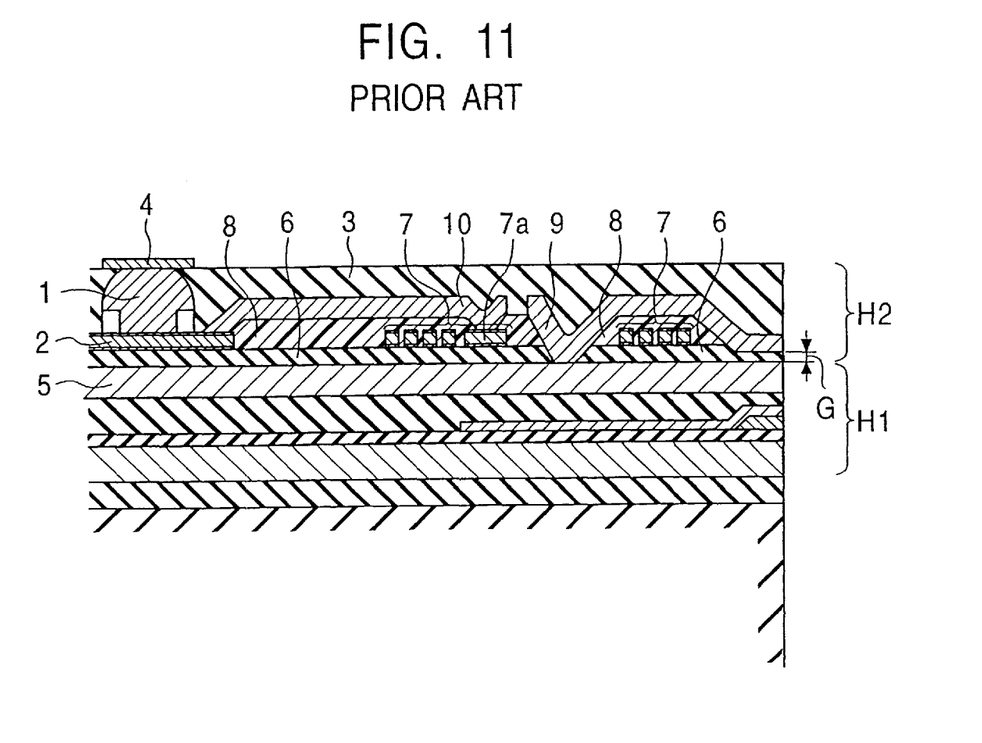
FIG. 11 is a cross-sectional view of the MR/inductive hybrid thin-film magnetic head taken along the line XI—XI in FIG. 10.

The thin-film structure can be used in the construction of an inductive head of a magnetoresistive (MR)/inductive hybrid head shown in FIGS. 10 and 11.

FIG. 10 is a plan view showing a so-called MR/inductive hybrid head in which a recording inductive head H2 is disposed on a reading MR thin-film magnetic head H1. FIG. 11 is a cross-sectional view of the MR/inductive hybrid head taken along the line XI—XI in FIG. 10.

As shown in FIG. 11, the recording inductive head H2 of the MR/inductive hybrid head is composed of a lower core layer 5, a gap layer 6, a coil layer 7, an insulating layer 8, an upper core layer 9, a lead layer 10, and an insulating layer 3 composed of $Al_2O_3$ in a laminated structure.

The coil layer 7 induces a recording magnetic field to the lower core layer 5 and the upper core layer 9. In FIG. 10, for ease of illustration in the figure, the coil layer 7 is drawn as concentric circles instead of as a coil.

The coil layer 7 is in electrical contact with the lead layer 10 at an central edge 7a of the coil layer 7, and the lead layer 10 is connected to a bump 1 via the electrically conductive layer 2 at the other edge of the lead layer 10 opposite to the edge thereof contacted with the central edge 7a of the coil layer 7. The electrically conductive layer 2, which is an elevating layer, is simultaneously formed, when the coil layer 7 is formed, by plating using the same material as is used for the coil layer 7.

In the conventional thin-film structure shown in FIG. 9, the bump 1 formed on the electrically conductive layer 2 is exposed at the surface of the insulating layer 3, and the electrode layer 4 in electrical contact with the bump 1 is used as an external electrode.

Figure 12:
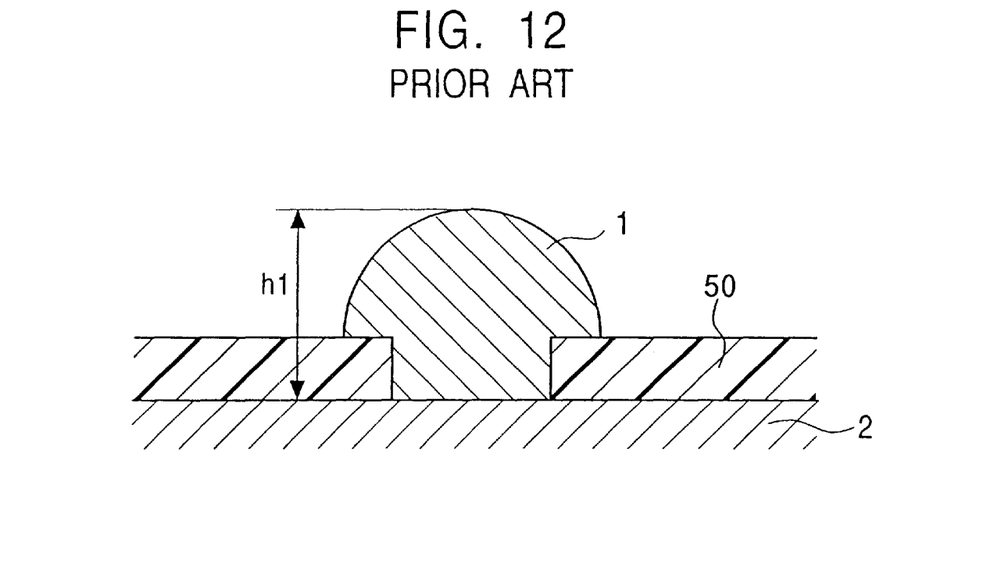
FIG. 12 is a cross-sectional view showing a state of a bump formed on an elevating layer in a manufacturing process of a conventional thin-film structure.
Figure 13:
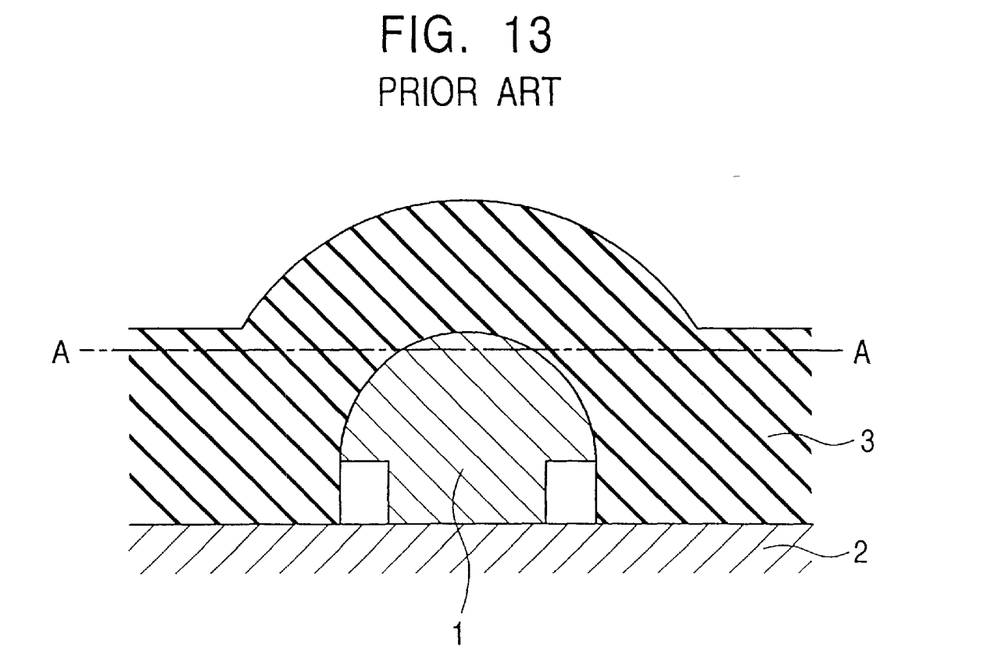
FIG. 13 is a cross-sectional view showing a state of the bump and the elevating layer in FIG. 12 covered with an insulating layer.
Figure 14:
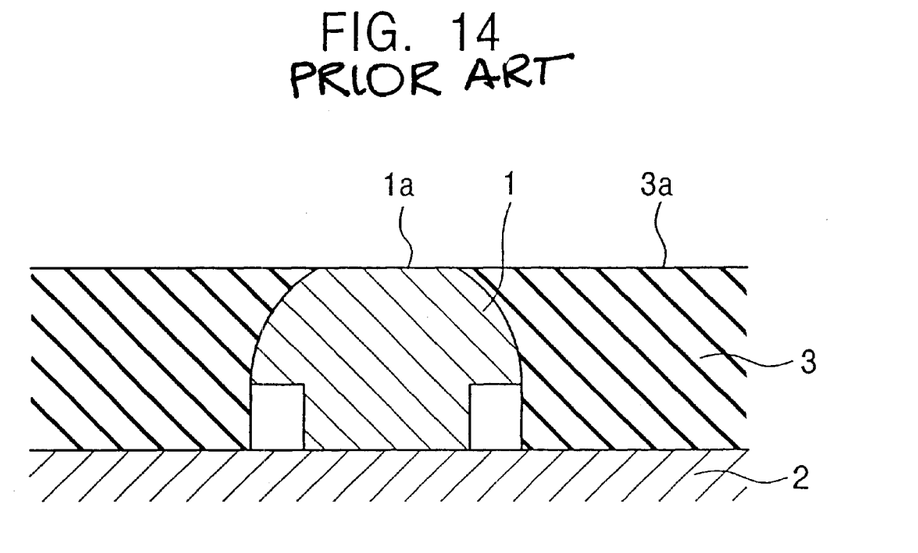
FIG. 14 is a cross-sectional view showing a state of the insulating layer polished away to the line A—A in FIG. 13.

FIGS. 12 to 14 are cross-sectional views of the thin-film structures in FIG. 9 in a manufacturing method therefor.

First, a resist layer 50 for forming the bump is formed on the electrically conductive layer 2, and an opening is formed in the resist layer 50 at an area at which the bump is to be formed. In the opening, the single-layer bump 1, as shown in FIG. 12, composed of copper, or composed of an electrically conductive material containing copper, is formed by isotropic plating. The height hi of the bump 1 is, for example, 40 μm. After forming the bump 1, the resist layer 50 for forming the bump is removed.

After forming the bump 1, as shown in FIG. 13, the insulating layer 3 composed of $Al_2O_3$ or $SiO_2$ is formed on the electrically conductive layer 2 and the bump 1.

Next, the insulating layer 3 is polished so that the surface of the bump 1 is exposed, for example, to the level indicated by the line A—A in FIG. 13. The exposed face of the bump 1 is flush with the surface 3a of the insulating layer 3 so as to form the flat face 1a, as shown in FIG. 14.

Finally, the electrode layer 4 is formed on the flat face 1a of the bump 1, whereby the thin-film structure shown in FIG. 9 is completed.

However, in the step shown in FIG. 14, the flat surface 1a of the bump 1 is exposed to the air, and an oxide layer may form thereon. In particular, when heat is applied in a rinsing/drying process or the like after a polishing process for planarizing the surface 3a of the insulating layer 3, the flat face 1a of the bump 1 is susceptible to forced oxidation.

When the flat face 1a of the bump 1 is oxidized, an oxide layer forms on the flat face 1a. In the case in which the electrode layer 4 is formed on the surface of the flat face 1a with the oxide layer thereon, the cohesion and the electrical conduction between the bump 1 and the electrode layer 4 are degraded, so that electrical contact failure readily occurs, and direct current resistance of the thin-film device becomes unstable, and as a result, the recording/reading characteristics are degraded.

When the oxide layer forms on the flat face 1a of the bump 1, there are methods for removing the oxide layer by using ion-milling, sputter etching, and the like. However, in the case in which the bump 1 is the single layer structure composed of copper or an electrically conductive material containing copper, the thickness of the oxide layer formed by exposure to the air varies in accordance with the conditions when the oxide layer was formed, and as a result, the thickness of the oxide layer on the flat face 1a of the bump 1 cannot be predicted.

Consequently, when the conditions for ion-milling are determined so as to remove a predetermined thickness of the oxide layer formed on the flat face 1a of the bump 1, the oxide layer may not be reliably removed since a predetermined thickness to be removed is too small, or conversely, an area of the bump 1, which is not oxidized, may be removed. Accordingly, there is a problem in that the characteristics of the thin-film structures vary from product to product.

SUMMARY OF THE INVENTION

In order to solve the conventional problems described above, it is an object of the present invention to provide a thin-film structure and a manufacturing method therefor, in which an oxide layer formed on a bump constructing the thin-film structure of the thin-film device can be reliably removed, and cohesion and electrical conduction between the bump and an electrode layer are improved, whereby electrical contact defects therebetween can be reduced.

A thin-film structure of the present invention comprises an electrically conductive layer, an insulating layer formed on the electrically conductive layer, and the bump formed on the surface of the electrically conductive layer, in which the bump is exposed at the surface of the insulating layer and the surface of the bump is flush therewith so as to form a flat face. The bump comprises an electrically conductive material layer and a protective layer, in which the protective layer covers the surface the electrically conductive material layer, is composed of a material which is not as easily oxidized as the electrically conductive material layer, and is on the flat face.

In a process for forming the thin-film structure of the present invention, after the bump composed of $Al_2O_3$, $SiO_2$, or the like is covered with the insulating layer, the insulating layer and the bump are polished, so that the bump is exposed at the surface of the insulating layer. The exposed face of the bump is flush with the surface of the insulating layer of the thin-film device so as to form the flat face.

The bump of the present invention is composed of the electrically conductive material layer and the protective layer which is composed of a material not as easily oxidized as the electrically conductive material layer and which is on the flat face.

Consequently, even though the flat face of the bump is exposed to the air at room temperature or to heated air, formation of the oxide layer on the flat face of the bump can be suppressed compared to that in a conventional one.

When the insulating layer and the bump are polished so that the bump is exposed at the surface of the insulating layer and the surface of the bump is flush with that of the insulating layer, the electrically conductive material layer may be exposed at the flat face of the bump when the thickness of the protective layer is too thin.

Accordingly, the protective layer preferably has a minimum predetermined thickness. In the case in which the thin-film structure of the present invention is used in the construction of a thin-film device, such as a thin-film magnetic head and a thin-film transistor, the thickness of the protective layer in an area other than the flat face of the bump is preferably, for example, not less than 5 $\mu$m.

In addition, the electrically conductive material layer constructing the bump preferably comprises a copper layer or a copper-containing layer, and the protective layer preferably comprises a nickel layer or a nickel-containing layer.

When the electrically conductive material layer of the bump is formed using copper which has superior electrical conductivity due to the low resistance thereof, electrical conductivity of the entire thin-film structure is superior and high-frequency characteristics of the thin-film device are also improved.

Even though the nickel layer or the nickel-containing layer is exposed to the air at room temperature or to heated air so that the oxide layer forms thereon, it is believed that the oxide layer will not exceed a certain thickness.

For example, in the case in which the protective layer is composed of nickel or an electrically conductive material containing nickel, it has been experimentally confirmed that the thickness of the oxide layer formed on the surface of the flat face of the bump is at most approximately 3.0 $\mu$m.

Consequently, when approximately 3.0 $\mu$m of the oxide layer formed on the flat face of the bump is removed from the surface thereof using a dry etching method, such as ion-milling or sputter etching, the oxide layer is reliably removed from the surface of the flat surface of the bump.

Furthermore, it is more preferable that the electrically conductive material layer constructing the bump be the copper layer or the copper-containing layer, and that the protective layer be a gold layer or a gold-containing layer formed on the nickel layer or the nickel-containing layer, in which the nickel layer, the nickel-containing layer, the gold layer, or the gold-containing layer is on the flat face.

In particular, when the gold layer or the gold-containing layer is on the flat face of the bump, oxidation of the surface of the flat face of the bump can be prevented. Accordingly, this is more preferable since it is not necessary to remove the oxide layer using a dry etching method.

However, when the surface of the electrically conductive material layer composed of the copper layer or the copper-containing layer is directly covered with the gold layer or the gold-containing layer, and when a temperature of 150° C. to 200° C. is applied in a process for forming the thin-film device after the formation of the bump, copper and gold may diffuse and may mix with each other in some cases.

In the case in which the electrically conductive material layer constructing the bump is the copper layer or the copper-containing layer, and the protective layer covering the electrically conductive material layer is the gold layer or the gold-containing layer formed on the surface of the nickel layer or the nickel-containing layer, the nickel layer or the nickel-containing layer functions as a diffusion-inhibiting layer to prevent copper and gold from diffusing and mixing with each other.

In addition, when the structure is the nickel layer or the nickel-containing layer formed on the surface of the electrically conductive material layer composed of the copper layer or the copper-containing layer, stress can be reduced. Consequently, separation of the electrically conductive material layer and the protective layer hardly occurs.

The electrically conductive material layer constructing the bump may comprise a nickel layer or a nickel-containing layer, and the protective layer may comprise a gold layer or a gold-containing layer.

In addition, the bump may be a single layer structure of the electrically conductive material layer of a nickel layer, a nickel-containing layer, a gold layer, or a gold-containing layer.

The thin-film structure of the present invention has an electrode layer formed on the flat face of the bump and is in electrical contact therewith, and for example, can be used as an electrode for a thin-film device of a thin-film magnetic head.

In the case in which the formation of the oxide layer on the surface of the flat face of the bump can be suppressed, and the oxide layer can be reliably removed from the surface of the flat face of the bump according to the present invention, when the electrode layer electrically contacting the bump is formed on the flat face thereof, or in the case in which the formation of the oxide layer on the surface of the flat face of the bump can be prevented, the cohesion and electrical conduction between the bump and the electrode layer can be improved, and electrical contact defects therebetween can be reduced.

Direct current resistance of a thin-film device having an electrically conductive layer and the thin-film structure of the present invention, such as a thin-film magnetic head, a thin-film inductor, and a thin-film transformer, can be stabilized.

A method for manufacturing a thin-film structure according to the present invention comprises a step (a) of forming a bump on an electrically conductive layer, in which the surface of the bump is composed of at least one of a nickel layer, a nickel-containing layer, a gold layer, and a gold-containing layer; a step (b) of forming an insulating layer on the electrically conductive layer and the bump; and a step (c) of polishing the insulating layer and the bump so as to form a flat face on which one of the nickel layer, the nickel-containing layer, the gold layer, and the gold-containing layer of the bump is at a level of the surface of the insulating layer.

In the present invention, the surface of the bump formed in the step (a) is composed of at least one of the nickel layer, the nickel-containing layer, the gold layer, and the gold-containing layer. Hence, in the step (c), the surface exposed at the surface of the insulating layer of the thin-film device, that is, the flat face of the bump, is composed of one of the nickel layer, the nickel-containing layer, the gold layer, and the gold-containing layer.

In the case in which the flat face of the bump is one of the exposed surfaces of the nickel layer, the nickel-containing layer, the gold layer, and the gold-containing layer, even though the oxide layer forms on the flat face of the bump at room temperature or in heated air, it is believed that the oxide layer will not exceed a certain thickness.

For example, when the flat face of the bump is an exposed surface of the nickel layer or the nickel-containing layer, it has been experimentally confirmed that the thickness of the oxide layer formed on the surface of the flat face of the bump is at most approximately 3.0 μm.

Consequently, in the case in which the nickel layer or the nickel-containing layer is on the flat face in the step (c), the method for manufacturing the thin-film structure further comprises a step (d) of dry etching the surface of the nickel layer or the nickel-containing layer so as to remove the oxide layer thereon. By removing approximately 3.0 nm or more of the oxide layer formed on the flat face of the bump from the surface thereof, the oxide layer is reliably removed from the surface of the flat face of the bump.

Meanwhile, in the case in which the gold layer or the gold-containing layer is on the flat face in the step (c), the oxidation of the flat face of the bump is prevented, and hence, the step of dry etching is not necessary.

In addition, in the step (a), the nickel layer, the nickel-containing layer, the gold layer, or the gold-containing layer is preferably formed on the copper layer or the copper-containing layer so as to form the bump.

When a main body of the bump is primarily formed using copper or the copper-containing material which has superior electrical conductivity due to the low resistance thereof, electrical conductivity of the thin-film structure is superior and high-frequency characteristics of the thin-film device are also improved.

Furthermore, in the step (a), the bump composed of the nickel layer or the nickel-containing layer formed on the surface of the copper layer or the copper-containing layer and the gold layer or the gold-containing layer formed on the nickel layer or the nickel-containing layer is more preferable.

When the gold layer or the gold-containing layer is formed on the surface of the copper layer or the copper containing layer so as to form the bump, copper and gold may diffuse and may mix with each other in some cases. Hence, it is preferable that the nickel layer or the nickel-containing layer functioning as a diffusion-inhibiting layer be formed between the copper layer or the copper-containing layer and the gold layer or the gold-containing layer.

In the step (a), it is preferable that the nickel layer, the nickel-containing layer, the gold layer, or the gold-containing layer be formed at not less than a predetermined thickness, for example, not less than 5 μm.

When the nickel layer, the nickel-containing layer, the gold layer, or the gold-containing layer is formed to be not less than the predetermined thickness, and when the insulating layer and the bump are polished so that the surface of the bump is flush with that of the insulating layer to form the flat face in the step (c), over-polishing to the point that the nickel layer, the nickel-containing layer, the gold layer, or the gold-containing layer is completely removed from the surface of the flat face is avoided.

The method for manufacturing the thin-film structure of the present invention may further comprise a step, following the steps (c) and (d), of forming the electrode layer electrically contacting the bump on the flat face of the surfaces of the bump and the insulating layer, and as a result, an electrode usable in a thin-film device, such as a thin-film magnetic head, can be formed.

As described in the method for forming the thin-film structure of the present invention, when the oxide layer can be reliably removed from the surface of the flat face of the bump, or when the formation of the oxide layer on the surface of the flat face of the bump can be prevented, the thin-film device can be manufactured having improved cohesion and electrical conduction between the bump and the electrode, and in which electrical contact defects therebetween can be reduced.

DESCRIPTION OF THE PREFERRED EMBODIMENTS

Figure 1:
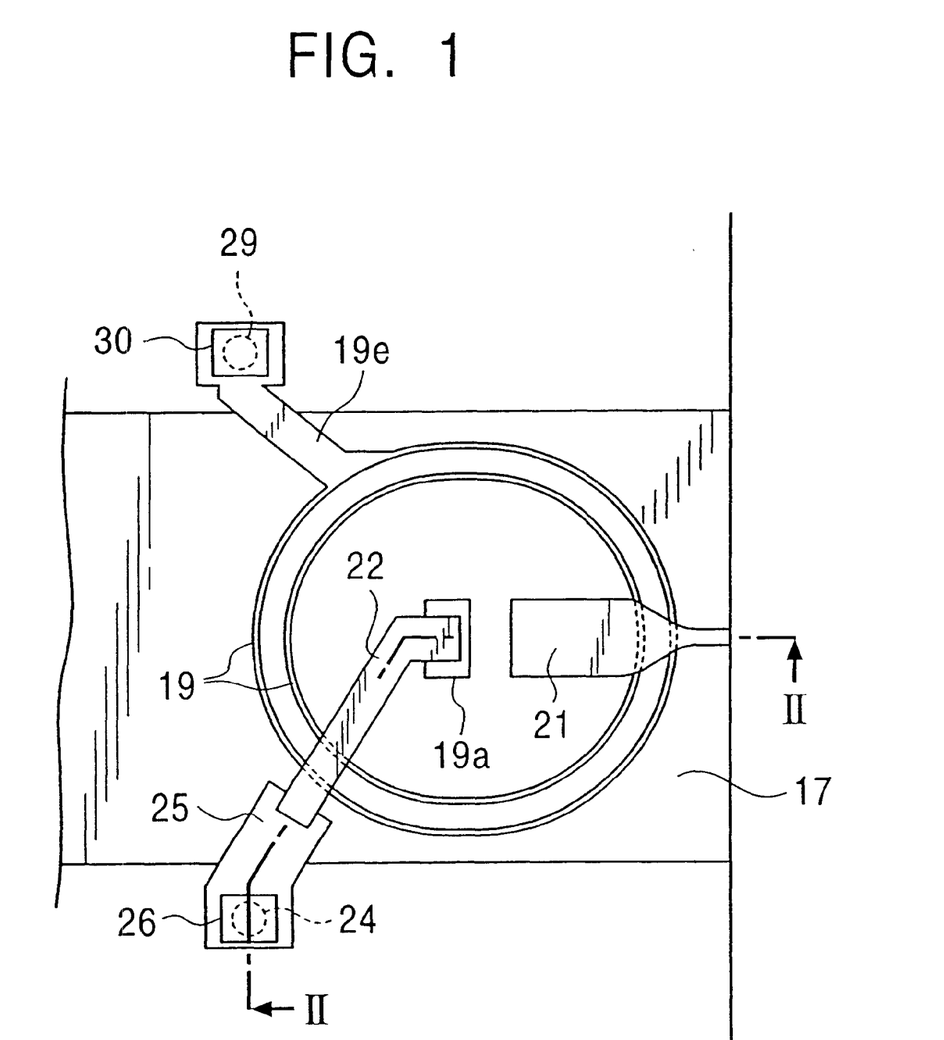
FIG. 1 is a plan view of an MR/inductive hybrid thin-film magnetic head having an inductive head composed of a thin-film structure of the present invention.
Figure 2:
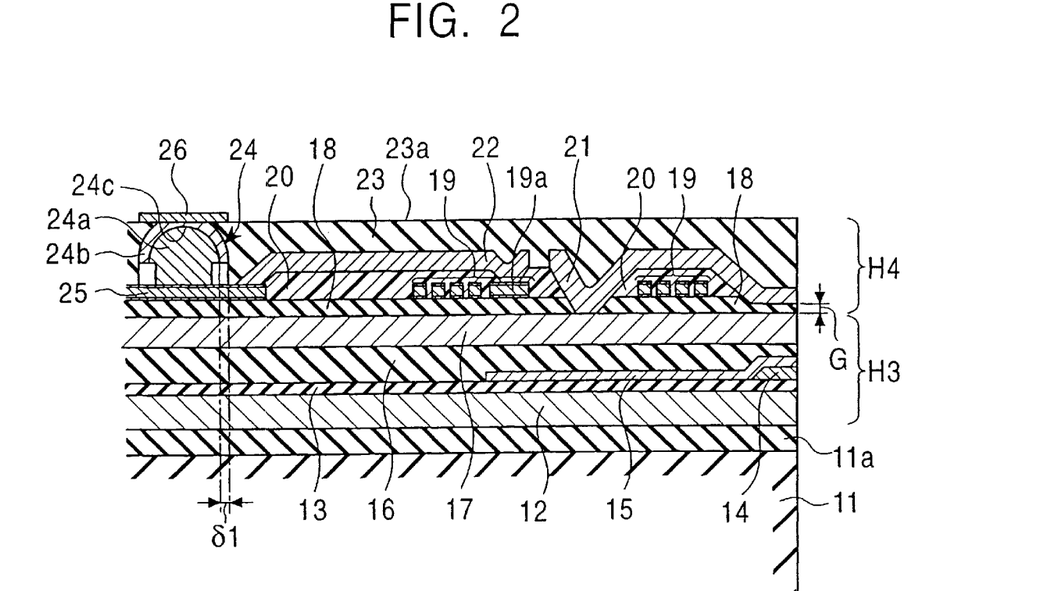
FIG. 2 is a cross-sectional view of the MR/inductive hybrid thin-film magnetic head taken along the line II—II in FIG. 1.

FIG. 1 is a plan view showing a so-called magnetoresistive (MR)/inductive hybrid head having a recording inductive head H4 formed on a reading MR thin-film head H3. A thin-film structure of the present invention can be used, for example, in the construction of the inductive head H4. FIG. 2 is a cross-sectional view of the MR/inductive hybrid head taken along the line II—II in FIG. 1.

As shown in FIG. 2, the reading MR thin-film magnetic head H3 of the MR/inductive hybrid head is formed in a laminated structure composed of an undercoat film 11a, which is composed of $Al_2O_3$ or the like and is formed on a slider 11 composed of alumina-titanium-carbide, a lower shield layer 12, a lower gap layer 13, an MR element layer 14, an electrode layer 15, an upper gap layer 16, and an upper shield layer 17.

The recording inductive head H4 disposed on the reading MR thin-film magnetic head H3 is formed in a laminated structure composed of a lower core layer 17 which is also used as the upper shield layer 17, a gap layer 18, a coil layer 19, an insulating layer 20, an upper core layer 21, a lead layer 22, and an insulating layer 23.

A front end of the gap layer, which is disposed between the lower core layer 17 and the upper core layer 21 and opposes a recording medium, forms a magnetic gap G. The coil layer 19 is flatly formed on the gap layer 18 and induces a recording magnetic field to the lower core layer 17 and the upper core layer 21. In FIG. 1, for ease of illustration in the figure, the coil layer 19 is drawn as concentric circles instead of as a coil.

The gap layer 18 and the insulating layer 23 of the inductive head H4 are composed of an insulating material, such as $Al_2O_3$ or $SiO_2$, and the lower layer 17, the upper core layer 21, and the lead layer 22 are composed of a electrically conductive soft magnetic material, such as permalloy. The insulating layer 20 is composed of a novolac resin, a polyimide resin, or the like.

The coil layer 19 is in contact with the lead layer 22 at a central edge 19a of the coil layer 19, and the lead layer 22 is connected to a bump 24 via an elevating layer 25 at the other edge of the lead layer 22 opposite to the edge in contact with the central edge 19a of the coil layer 19. The elevating layer 25 is simultaneously formed, when the coil layer 19 is formed, by plating using the same material as is used for the coil layer 19.

In a thin-film structure of the embodiment, the bump 24 formed on the surface of the electrically conductive elevating layer 25 is exposed at the surface of the insulating layer 23, and the electrode layer 26 is in direct contact with the bump 24 so as to be electrically conductive. The surface of the bump 24 and the surface of the insulating layer 23 are flush with each other. The bump 24 is composed of a nickel layer 24b as a protective layer formed on a surface of a copper layer 24a which is an electrically conductive layer. The electrode layer 26 is composed of gold or an electrically conductive material containing gold. The thin-film structure of the embodiment is used as an external electrode of the thin-film magnetic head.

When the bump 24 is formed, the nickel layer 24b is exposed at the surface of the insulating layer 23. The exposed face of the nickel layer 24b is used as a flat face 24c of the bump 24.

The height h2 of the copper layer 24a is, for example, 30 μm. The thickness δ1 of the nickel layer 24b other than the portion to be the flat face 24c is, for example, 5 μm.

The electrode layer 26 is formed on the flat face 24c of the bump 24 by plating.

Between the formation of the flat face 24c of the bump 24 and that of the electrode 26, the flat surface 24c is exposed to the air, and an oxide layer may form thereon. In particular, for example, when heat is applied to the flat face 24c in a step of rinsing/drying after a polishing step of planarizing the surface 23a of the insulating layer 23, the flat face 24c of the bump 24 is susceptible to forced oxidation.

However, it has been experimentally confirmed that the thickness of the oxide layer formed on a nickel layer is, in general, at most approximately 3.0 nm when the surface of the nickel layer is oxidized at room temperature or in heated air. That is, in the case in which the flat face 24c on which the oxide layer forms is an exposed face of the nickel layer 24b, as in this embodiment, the thickness of the oxide layer to be formed is at most approximately 3.0 nm.

Consequently, by polishing away approximately 3.0 nm of the oxide layer formed on the flat face 24c from the surface thereof using a dry etching method, such as ion-milling, sputter etching, the oxide layer on the flat face 24c can be reliably removed.

Since the oxide layer on the flat face 24c can be reliably removed as described above, in the thin-film structure of the embodiment, the cohesion and electrical conduction between the bump 24 and the electrode 26 can be improved, and electrical contact defects therebetween can be reduced. In addition, direct current resistance of the thin-film magnetic head can be stabilized.

The electrically conductive material layer composing the bump 24 may be a nickel layer or a nickel-containing layer instead of the copper layer 24a. In addition, the protective layer may be a gold layer or a gold-containing layer instead of the nickel layer 24b.

The bump may be a single layer structure of a nickel layer, a gold layer, or an electrically conductive layer containing nickel or gold.

FIGS. 3 to 6 are cross-sectional views of the thin-film structure in FIG. 2 in a manufacturing process therefor.

Figure 3:
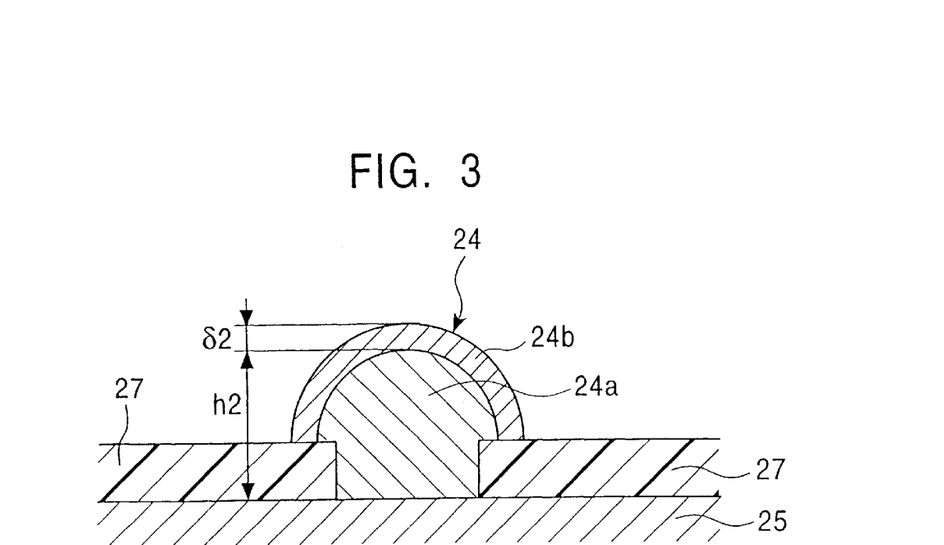
FIG. 3 is a cross-sectional view showing a state of a bump formed on an elevating layer in a manufacturing process of the thin-film structure of the present invention.

First, a resist layer 27 for forming the bump 24 is formed on the elevating layer 25, and an opening in the resist layer 27 is formed in an area at which the bump is to be formed. The copper layer 24a is formed in this opening by an isotropic plating using copper, and the nickel layer 24b is then formed on the surface of the copper layer 24a by plating using nickel (FIG. 3).

The height h2 of the copper layer 24a is, for example, 30 μm. The thickness δ2 of the nickel layer 24b is, for example, 5 μm.

After forming the bump 24, the resist 27 for forming the bump is removed.

Figure 4:
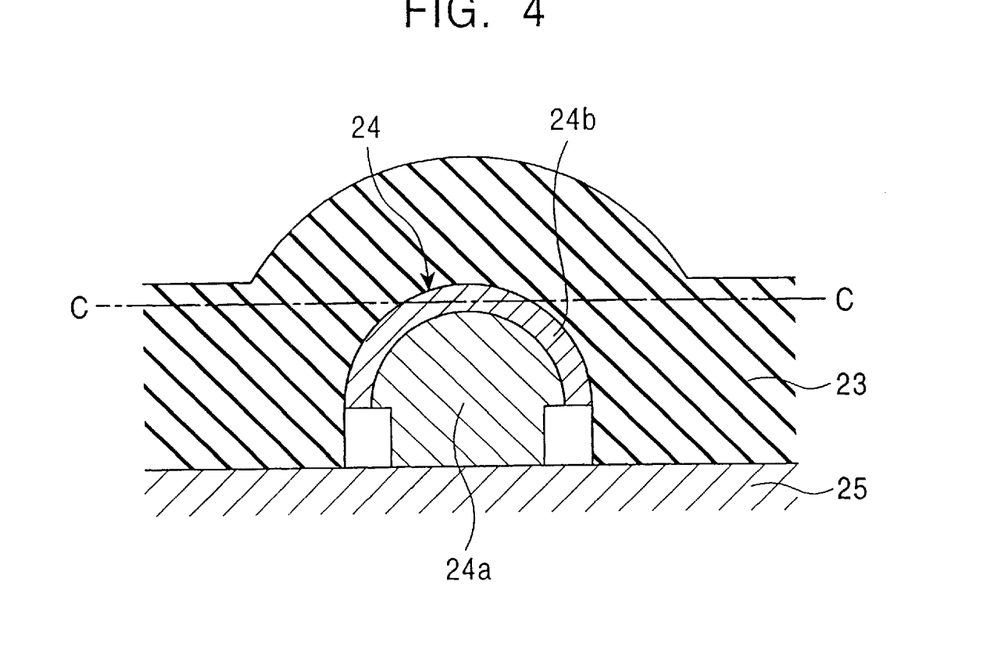
FIG. 4 is a cross-sectional view showing a state of the bump and the elevating layer in FIG. 3 covered with an insulating layer.

After forming the bump 24, as shown in FIG. 4, the insulating layer 23 composed of an insulating material, such as $Al_2O_3$ or $SiO_2$, is formed on the elevating layer 25 and the bump 24.

Figure 5:
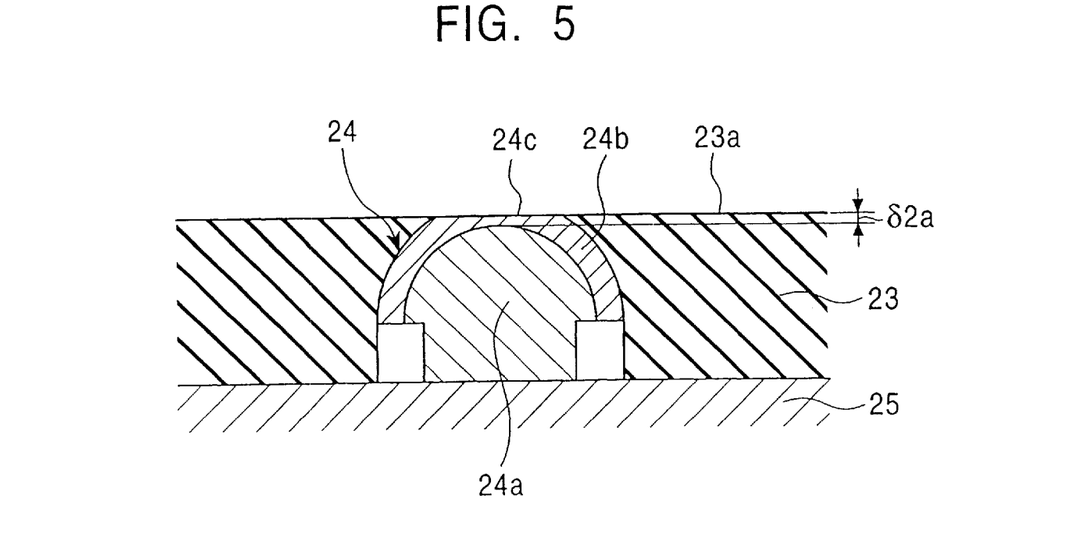
FIG. 5 is a cross-sectional view showing a state of the insulating layer polished away to the line C—C in FIG. 4.

Next, the insulating layer 23 is polished away, for example, to the level indicated by the C—C line in FIG. 4, so that the surface of the nickel layer 24b of the bump 24 is exposed. The exposed face of the nickel layer 24b is the flat face 24c which is flush with the surface 23a of the insulating layer 23, as shown in FIG. 5. The distance δ2a between the flat face 24c and the copper layer 24a is designed to be not less than 3.0 nm. In the embodiment, δ2a is set to be 0.5 to 1.0 μm.

Between the formation of the flat face 24c of the bump 24 to be in contact with the electrode 26 and the formation of the electrode 26, an oxide layer may form on the surface of the flat face 24c.

Accordingly, the oxide layer is removed from the flat face 24c. Since the flat face 24c is an exposed face of the nickel layer 24b, the thickness of the oxide layer is at most approximately 3.0 nm. Consequently, by polishing away approximately 3.0 nm or more of the flat face 24c from the surface thereof using ion-milling or sputter etching, the oxide layer on the flat face 24c can be reliably removed. In the embodiment, 4.0 to 8.0 nm of the flat face 24c is polished away.

In the embodiment, the flat face 24c is polished away so that the copper layer 24a under the nickel layer 24b is not to be polished.

Hence, the change in the volume of the copper layer 24a can be prevented. Since the volume of the copper layer 24a is a parameter determining allowable current and resistance of the thin-film structure, when the change in the volume of the copper layer 24a is prevented, a thin-film magnetic head provided with the thin-film structure having uniform allowable current and the resistance can be formed. That is, the uniform qualities of the thin-film magnetic head can be easily maintained.

Figure 6:
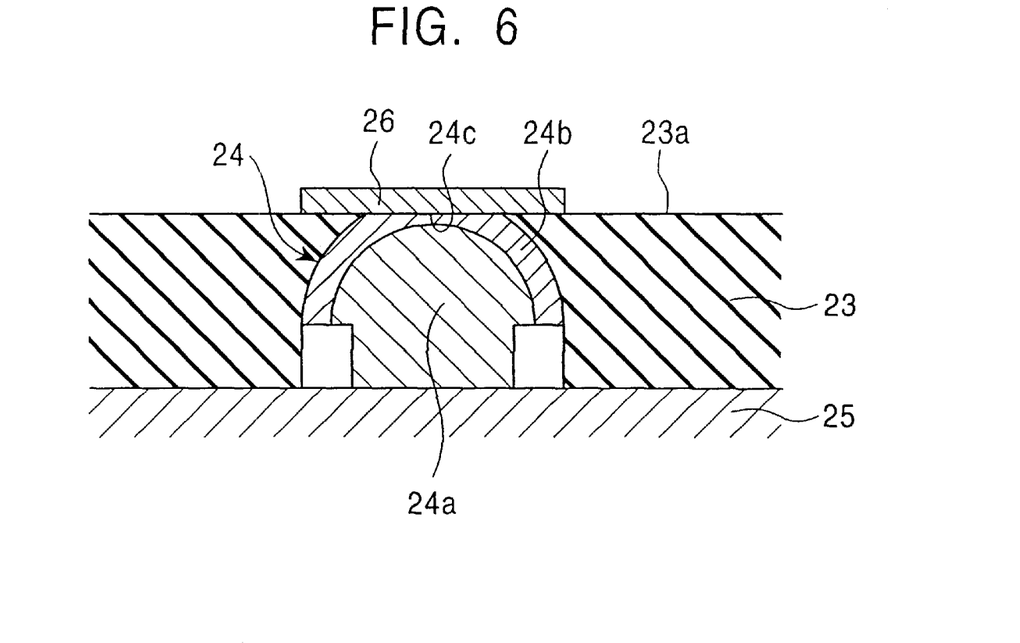
FIG. 6 is a cross-sectional view showing a completed state of the thin-film structure of the present invention, in which an electrode layer is formed on the bump in FIG. 5.

Finally, the electrode layer 26 is formed by plating using gold or an electrically conductive material containing gold on the flat face 24c of the bump 24, whereby the thin-film structure shown in FIG. 6 is completed.

In the method for manufacturing the thin-film structure of the present invention, as is thus described, the electrode layer 26 is formed after reliably removing the oxide layer on the flat face 24c of the bump 24 to be in contact with the electrode layer 26, and consequently, the cohesion and electrical conduction between the bump 24 and the electrode layer 26 can be improved, and electrical contact defects therebetween can be reduced.

Figure 7:
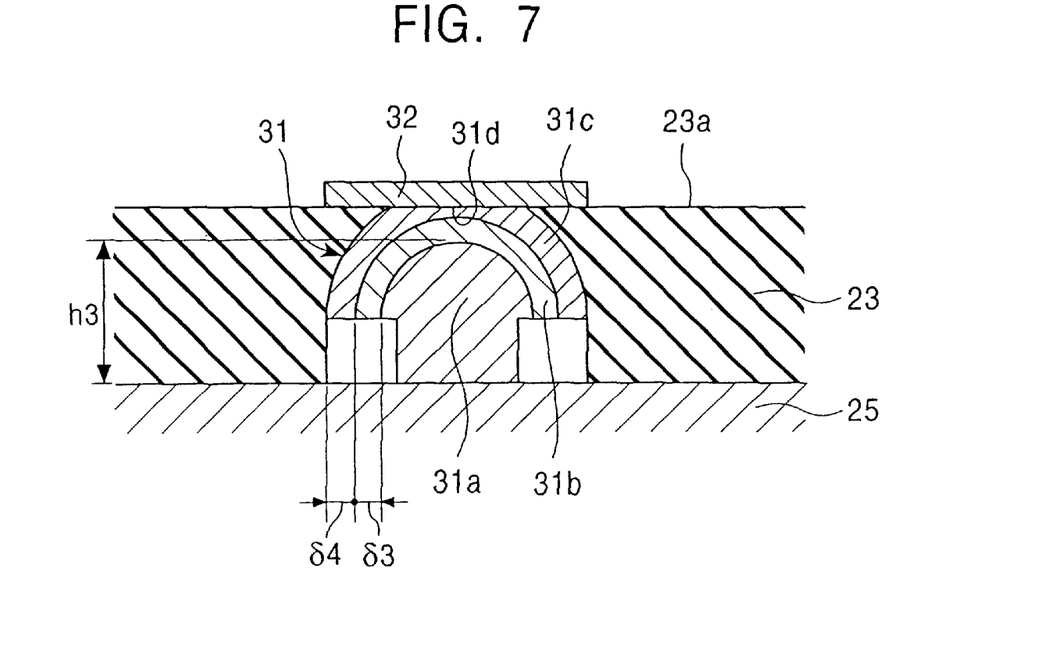
FIG. 7 is a cross-sectional view of a thin-film structure of another embodiment according to the present invention.

FIG. 7 is a cross-sectional view of another embodiment of the present invention.

A thin-film structure of this embodiment is one in which a bump 31 is formed on the surface of the elevating layer 25 which is an electrically conductive layer and the bump is exposed at the surface of the insulating layer 23, and an electrode layer 32 is in electrical contact with the bump 31. The surface of the bump 31 and the surface of the insulating layer 23 are flush with each other so as to form a flat face. The bump 31 is composed of an electrically conductive layer which is a copper layer 31a and a protective layer provided thereon composed of a gold layer 31c formed on a nickel layer 31b. The electrode layer 26 is composed of gold or an electrically conductive material containing gold. The thin-film structure may also be used as an external electrode of the thin-film magnetic head.

When the thin-film structure of the embodiment is formed, the gold layer 31c is exposed at the surface of the insulating layer 23. The exposed face of the gold layer 31c is to be a flat face 31d of the bump 31.

The electrode layer 32 is formed on the flat face 31d of the bump 31 by plating.

In the embodiment, the height h3 of the copper layer 31a is, for example, 20 μm. In addition, the thickness δ3 of the nickel layer 31b and the thickness δ4 of the gold layer 31c are, for example, 0.5 to 5.0 μm for both of them.

Between the formation of the flat face 31d of the bump 31 and that of the electrode layer 32, the flat face 31d may be exposed to the air. However, the flat face 31d is an exposed face of the gold layer 31c in the embodiment, and hence, the flat face 31d is not oxidized.

Consequently, without polishing the surface of the flat face 31d by ion-milling or the like, the cohesion and electrical conduction between the bump 31 and the electrode layer 32 can be improved, and electrical contact defects therebetween can be reduced. In addition, direct current resistance of the thin-film magnetic head can be stabilized.

In the embodiment, the nickel layer 31b is formed between the copper layer 31a and the gold layer 31c. The nickel layer 31b functions as a diffusion-inhibiting layer. Hence, in a process for forming the thin-film magnetic head, even though a temperature of 150° C. to 200° C. is applied thereto after the formation of the thin-film structure, diffusion of copper and gold and mixing thereof can be prevented.

Furthermore, a structure having the nickel layer 31b formed on the surface of the copper layer 31a can reduce stress. Hence, the copper layer 31a and the nickel layer 31b are difficult to separate.

The thin-film structure of the embodiment in which the nickel layer 31b of the bump 31 is covered with the gold layer 31c, as thus described, has the following advantages.

The lead layer 22 is formed by plating using permalloy (NiFe). In this step, in order to have permalloy easily flow to areas to be plated, appropriate areas other than the area at which the lead layer 22 is to be formed are plated as a dummy. After the formation of the lead layer 22, the bump 31 is formed on the lead layer 22. After the formation of the bump 31 and before the formation of the insulating layer 23, the dummy plated on the appropriate area is removed by wet-etching. In this step, the lead layer 22 and the bump 31 are protected by a resist layer 28 covering thereon.

Figure 8:
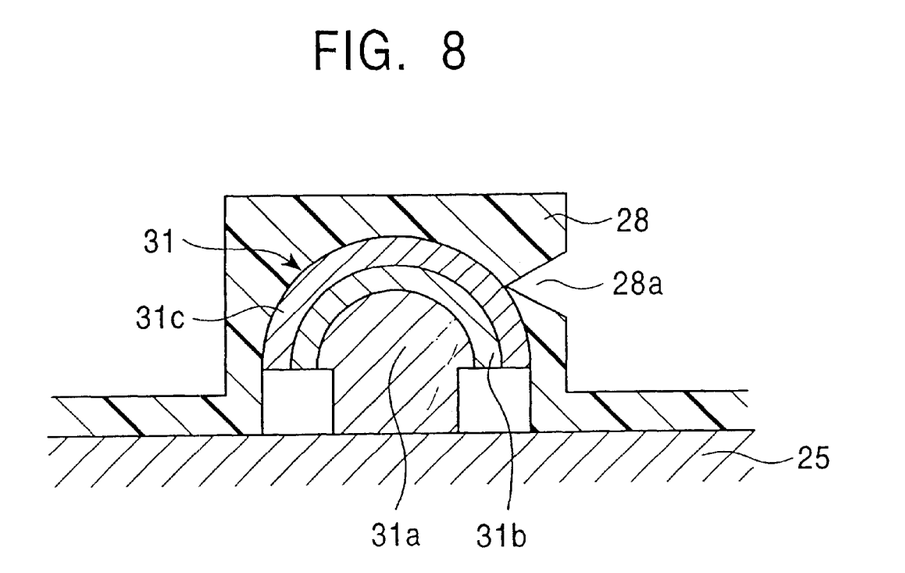
FIG. 8 is a cross-sectional view showing a state of a bump constructing the thin-film structure in FIG. 7 covered with a resist layer.

FIG. 8 is an enlarged cross-sectional view of the bump 31 covered with the resist layer 28 and the vicinity thereof. The height of the bump 31 is approximately 40 μm. It is difficult for the resist layer 28 to cover the entire bump having the height mentioned above. For example, an opening 28a caused by air bubbles introduced into the resist layer 28 is formed, and as shown in FIG. 8, an exposure of a part of the bump 31 is frequently observed.

In addition, an etchant for dissolving permalloy, which is used for etching the dummy plated on the appropriate area, also dissolves nickel.

Consequently, when the surface of the bump is covered with the nickel layer as shown in FIG. 6, the surface of the nickel layer at which the bump is partly exposed is dissolved, so that the characteristics of the bump are changed.

However, in the case in which the surface of the bump 31 is covered with the gold layer 31c, the gold layer 31c protects the nickel layer 31b when the dummy plated in the appropriate area is etched, whereby the nickel layer 31b of the bump 31 is not dissolved even though a part of the bump 31 is exposed as shown in FIG. 8. That is, bumps having uniform characteristics can be reliably manufactured, and the qualities of the thin-film magnetic heads can be improved.

In the two embodiments described above, the thin-film structure of the present invention is applied to the thin-film structure formed on the lead layer 22 of the thin-film magnetic head in FIG. 1. The thin-film structure of the present invention can also be applied to a thin-film structure composed of the bump 29 and the electrode layer 30 and formed on a lead portion 19e of the coil layer 19 of the thin-film magnetic head in FIG. 1. This thin-film structure is used as an external electrode.

Furthermore, the thin-film structure of the embodiment may be used in the construction of thin-film magnetic device other than the thin-film magnetic head, such as a thin-film inductor and a thin-film transformer.

As has thus been described, in the present invention, since the flat face of the bump of the thin-film structure is composed of nickel or an electrically conductive material containing nickel, even though an oxide layer forms on the flat face of the bump in a process for forming the thin-film structure, the thickness of the oxide layer is at most approximately 3.0 nm. Consequently, the oxide layer on the flat face of the bump can be reliably removed using ion-milling or sputter etching.

Furthermore, since the flat face of the bump of the thin-film structure is composed of gold or an electrically conductive material containing gold, an oxide layer does not form on the flat face of the bump in a process for forming the thin-film structure.

Consequently, the cohesion and electrical conduction between the bump and the electrode layer, which construct the thin-film structure, can be improved, and electrical contact defects therebetween can be reduced. In addition, direct current resistance of a thin film device constructed by using the thin-film structure of the present invention can be stabilized.

What is claimed is:

1. A thin-film structure comprising:

forming a bump on a first electrically conductive layer, said bump having a protective layer comprising one of a nickel layer and a nickel-containing layer, said protective layer being overlaid on a second electrically conducting layer, the second electrically conducting layer being one of a copper layer and a copper-containing layer;

forming an insulating layer on the first electrically conductive layer and the bump;

polishing the insulating layer and the bump to form a flat face such that a surface of the bump is level with a surface of the insulating layer; and dry etching the flat face when the protective layer is present on the flat face during polishing, and wherein, during the dry-etching, a portion of the flat face, including the protective layer, having a thickness in the range of about 4 nm to about 8 nm, is removed.

2. A method for manufacturing a thin-film structure according to claim 1, further comprising, following said dry etching, forming an electrode layer electrically contacting the bump on the flat face of the bump.

* * * * *

UNITED STATES PATENT AND TRADEMARK OFFICE
CERTIFICATE OF CORRECTION

PATENT NO. : 6,694,611 B2
DATED : February 24, 2004
INVENTOR(S) : Kiyoshi Sato

It is certified that error appears in the above-identified patent and that said Letters Patent is hereby corrected as shown below:

<u>Title page,</u>
Item [56], References Cited, FOREIGN PATENT DOCUMENTS, delete "12/1982" and substitute -- 12/1992 -- in its place.

<u>Column 12,</u>
Line 1, before "thin-film" insert -- method for manufacturing a --.

Signed and Sealed this

Sixth Day of July, 2004

JON W. DUDAS
*Acting Director of the United States Patent and Trademark Office*